US006642151B2

(12) United States Patent
Khan et al.

(10) Patent No.: US 6,642,151 B2
(45) Date of Patent: Nov. 4, 2003

(54) TECHNIQUES FOR PLASMA ETCHING SILICON-GERMANIUM

(75) Inventors: Anisul Khan, Santa Clara, CA (US); Ajay Kumar, Sunnyvale, CA (US); Padmapani Nallan, San Jose, CA (US)

(73) Assignee: Applied Materials, Inc, Santa Clara, CA (US)

( * ) Notice: Subject to any disclaimer, the term of this patent is extended or adjusted under 35 U.S.C. 154(b) by 0 days.

(21) Appl. No.: 10/093,050

(22) Filed: Mar. 6, 2002

(65) Prior Publication Data

US 2003/0176075 A1 Sep. 18, 2003

(51) Int. Cl.$^7$ .................. H01L 21/302; H01L 21/461
(52) U.S. Cl. .................. 438/714; 438/706; 156/345.31
(58) Field of Search .................. 438/706, 714, 438/602–606; 156/345.31

(56) References Cited

U.S. PATENT DOCUMENTS

| 4,687,543 A | * | 8/1987 | Bowker ................... 156/643 |
| 5,830,807 A | * | 11/1998 | Matsunaga et al. ........... 216/68 |
| 6,007,733 A | | 12/1999 | Jang et al. ................ 216/80 |
| 6,127,263 A | | 10/2000 | Parikh ..................... 438/637 |
| 6,201,999 B1 | | 3/2001 | Jevtic ..................... 700/100 |
| 6,225,207 B1 | | 5/2001 | Parikh ..................... 438/622 |
| 6,391,771 B1 | | 5/2002 | Naik et al. ................ 438/653 |

FOREIGN PATENT DOCUMENTS

| JP | 62-37935 | 2/1987 | ......... H01L/21/302 |
| JP | 4-106922 | 4/1992 | ......... H01L/21/302 |
| JP | 10-22269 | 1/1998 | ....... H01L/21/3065 |
| JP | P2001-135613 A | 5/2001 | ....... H01L/21/3065 |

OTHER PUBLICATIONS

SEMI Draft Doc. 2817, *New Standard; Provisional Specification for CIM Framework Domain Architecture*, published by Semiconductor Equipment and Materials International (SEMI), pp. 1–53, 1998.
Peter van Zandt, *Microchip Fabrication*, 3$^{rd}$ ed., McGraw–Hill, pp. 472–478, 1997.
P. Van Zant, *Microchip Fabrication*, McGraw–Hill, 4$^{th}$. Ed., pp. 481, 482, 2000.
R. Zorich, *Handbook Of Quality Integrated Circuit Manufacture*, Academic Press, Inc., pp. 545 546, 1991.

* cited by examiner

*Primary Examiner*—D Le
(74) *Attorney, Agent, or Firm*—Albert J Dalhuisen; Joseph Bach

(57) ABSTRACT

The present invention provides novel etching techniques for etching Si—Ge, employing $SF_6$/fluorocarbon etch chemistries at a low bias power. These plasma conditions are highly selective to organic photoresist. The techniques of the present invention are suitable for fabricating optically smooth Si—Ge surfaces. A cavity was etched in a layer of a first Si—Ge composition using $SF_6/C_4F_8$ etch chemistry at low bias power. The cavity was then filled with a second Si—Ge composition having a higher refractive index than the first Si—Ge composition. A waveguide was subsequently fabricated by depositing a cladding layer on the second Si—Ge composition that was formed in the cavity. In a further embodiment a cluster tool is employed for executing processing steps of the present invention inside the vacuum environment of the cluster tool. In an additional embodiment a manufacturing system is provided for fabricating waveguides of the present invention. The manufacturing system includes a controller that is adapted for interacting with a plurality of fabricating stations.

32 Claims, 7 Drawing Sheets

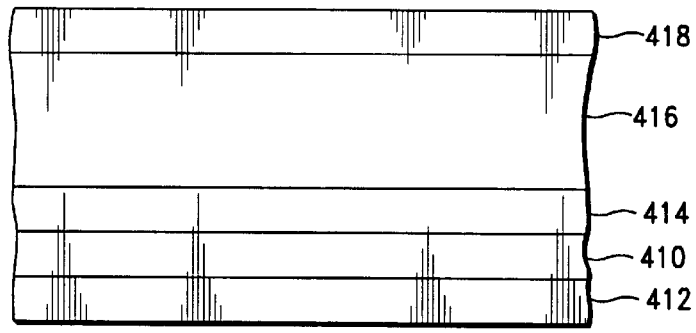
*FIG.—4A*
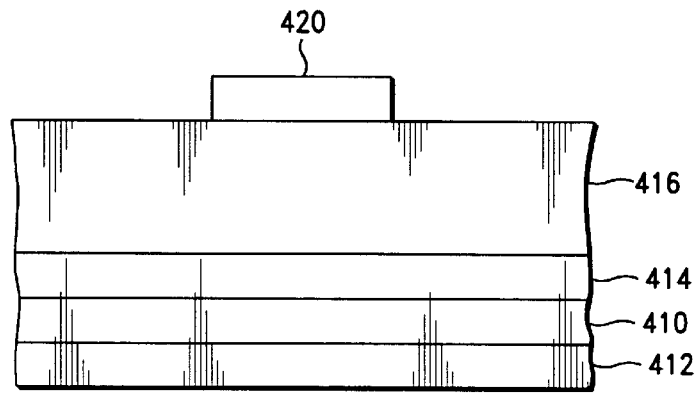
*FIG.—4B*
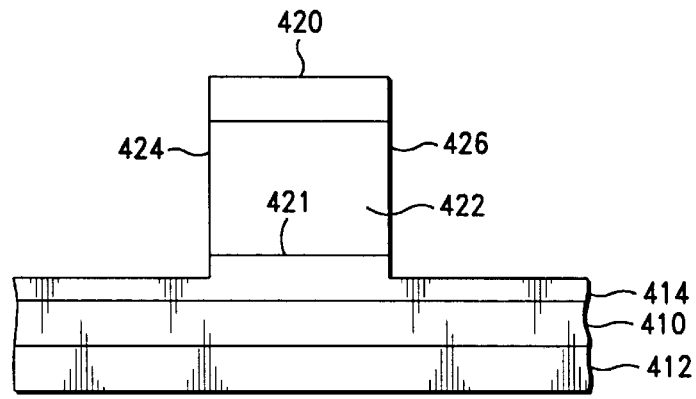
*FIG.—4C*

TECHNIQUES FOR PLASMA ETCHING SILICON-GERMANIUM

FIELD OF THE INVENTION

The present invention relates to processes, materials and devices for plasma etching of Si—Ge layers for fabricating optically smooth Si—Ge surfaces, and particularly to fabricating waveguides in opto-electronic integrated circuits employing Si—Ge.

BACKGROUND OF THE INVENTION

A waveguide is a conductor or directional transmitter for electromagnetic waves. Waveguides are, for example employed in opto-electronic integrated circuits. An opto-electronic integrated circuit (OEIC) device combines optics with electronics in an integrated form. OEIC technology is commonly used for example in optical fiber communication devices and methods. A typical OEIC includes conventional IC (integrated circuit) components as well as optical components. Conventional IC components include for example, transistors, diodes, resistors and electrically conductive interconnects. Examples of optical components include light receiving devices such as photodiodes, light emitting devices such as light emitting diodes (LED), optical reflectors such as metallic mirrors, optical filters and waveguides.

Typical OEIC waveguides are optical interconnects that provide an optical path between optical and/or opto-electronic components. Conventional waveguide materials that are employed in OEIC devices include monocrystalline silicon. Typically, an OEIC waveguide is embedded within sidewalls and top and bottom claddings. It is recognized that roughness of waveguide sidewall surfaces, and roughness of the surfaces of top and/or bottom claddings, results in light scattering that causes a significant light propagation loss when light is transmitted through the waveguide. It is therefore highly desirable to provide sidewall and cladding surfaces adjacent the waveguide that exhibit very low surface roughness.

Also, it is desirable to employ a waveguide sidewall material that is similar to the waveguide material in chemical and physical properties, particularly including mechanical and thermal properties, in order to maximize the reliability and durability of the waveguide structure in the OEIC device.

Desirably, techniques for fabricating OEIC waveguides should employ relatively low fabricating temperatures in order to limit, or avoid if possible, heat caused damage or degradation of other components of the OEIC structure such as a semiconductor wafer.

Si—Ge (silicon-germanium, also known as germanium doped silicon) is a suitable material for waveguides. Particularly when an Si—Ge waveguide is enclosed within Si—Ge sidewalls such that the Si—Ge waveguide material has a higher refractive index than the refractive index of the Si—Ge sidewall material. However, conventional Si—Ge etch techniques using etch chemistries such as $HBr/Cl_2$, result in Si—Ge sidewall roughness that causes a high level of light scattering. Also, these conventional etch chemistries exhibit a relatively low etch selectivity to organic photoresist; this low selectivity typically ranges from about 2–3:1. It has been found that this low selectivity is unsuitable for successfully etching the typical requirements of 1.5–7 $\mu$m Si—Ge with 1–2 $\mu$m resist.

Accordingly, the need exists for improved techniques for fabricating optically smooth Si—Ge surfaces and for fabricating Si—Ge waveguides exhibiting a very low light propagation loss.

SUMMARY OF THE INVENTION

The present invention provides novel methods and techniques for etching Si—Ge, which are particularly useful for fabricating optically smooth Si—Ge surfaces.

In one embodiment of the present invention a novel etch technique is employed for etching Si—Ge, wherein $SF_6$/hydrofluorocarbon etch chemistries are used at low bias power and wherein the etch technique is highly selective to organic photoresist. This etching technique results in optically smooth Si—Ge surfaces.

In another embodiment of the present invention an Si—Ge waveguide is fabricated by etching a cavity having optically smooth sidewall surfaces and an optically smooth bottom surface in a layer of a first Si—Ge composition, using $SF_6$/hydrofluorocarbon plasma etch chemistry at low bias power, and then filling the cavity with a second Si—Ge composition that has a higher refractive index than the first Si—Ge composition. A cladding layer is subsequently deposited on the second Si—Ge composition that is formed in the cavity, thus fabricating the waveguide.

In a further embodiment of the present invention an Si—Ge waveguide is fabricated by etching a cavity having optically smooth sidewall surfaces and an optically smooth bottom surface in a first layer of a first Si—Ge composition, using $SF_6$/fluorocarbon etch chemistries of the present invention, and then filling the cavity with a second Si—Ge composition that has a higher refractive index than the first Si—Ge composition. The top surface of the second Si—Ge composition is then etched, using $SF_6$/hydrofluorocarbon etch chemistries of the present invention to provide an optically smooth top surface of the second Si—Ge composition that is deposited in the cavity. Subsequently, a second layer of the first Si—Ge composition is then deposited on the etched top surface of the second Si—Ge composition. A cladding layer is then formed on the second layer of the first Si—Ge composition. This technique results in a waveguide core having optically smooth top, side and bottom surfaces.

In another embodiment of the present invention a waveguide core is fabricated by subtractively etching a layer of a first Si—Ge composition that is deposited on an optically smooth first layer of a second Si—Ge composition wherein the first Si—Ge composition has a higher refractive index than the second Si—Ge composition. The subtractive etching technique of the present invention includes $SF_6$/hydrofluorocarbon etch techniques of the present invention. A second layer of the second Si—Ge is deposited as a conformal layer on the core. Excess second layer material is removed from the core, and a top cladding layer is deposited on the core thereby forming the waveguide, wherein the core has optically smooth bottom and side surfaces.

In a further embodiment of the present invention a cluster tool is employed for executing processing steps of the novel techniques for fabricating Si—Ge waveguides of present invention. These processing steps include photoresist removal, Si—Ge etching, Si—Ge deposition and top cladding layer deposition, wherein the processing steps are carried out within the vacuum environment of the cluster tool.

In another embodiment of the present invention a manufacturing system is provided for fabricating Si—Ge waveguides of the present invention. This system includes a controller, such as a computer, that is adapted for interacting with a plurality of fabrication stations. Each of these fabrication stations performs a processing step that is utilized to fabricate the waveguides. Operative links provide connections between the controller and the fabrication stations. A data structure, such as a computer program, causes the controller to control the processing steps which are performed at the fabrication stations.

BRIEF DESCRIPTION OF THE DRAWINGS

FIGS. 4A–4F are cross sectional views illustrating another embodiment of the present invention at sequential stages.

DETAILED DESCRIPTION OF THE INVENTION

While describing the invention and its embodiments, certain terminology will be utilized for the sake of clarity. It is intended that such terminology includes the recited embodiments as well as all equivalents.

Figure 1A:
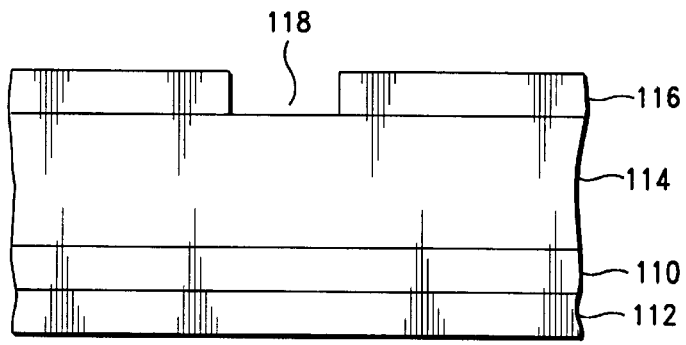
FIGS. 1A–1E are cross sectional views illustrating an embodiment of the present invention at sequential stages.

In one embodiment of the present invention, sequentially illustrated in the OEIC structures shown FIGS. 1A–1E, an Si—Ge waveguide was formed in a cavity such as a trench in an Si—Ge layer. The expressions "opto-electronic integrated circuit structure" and "OEIC structure" as defined herein, include completely formed OEIC structures and partially formed OEIC structures, also including OEIC containing semiconductor wafers. As shown in FIG. 1A, a bottom cladding layer 110 including a dielectric material, such as silicon oxide, was formed on a substrate 112 such as epitaxial Si. The surface of bottom cladding layer 110 was subsequently planarized using conventional planarizing techniques and materials that are well known to a person of ordinary skill in the art. A layer 114 of a first Si—Ge composition was then deposited epitaxially on the planarized surface of bottom cladding layer 110, using conventional Si—Ge plasma deposition techniques such as are well know to a person of ordinary skill in the art. This was followed by planarizing the surface of Si—Ge layer 114, using conventional planarizing techniques and materials. A conventional organic photoresist layer 116 was deposited on Si—Ge 114, after which an etch mask 118 for etching a cavity was formed in photoresist layer 116.

Figure 1B:
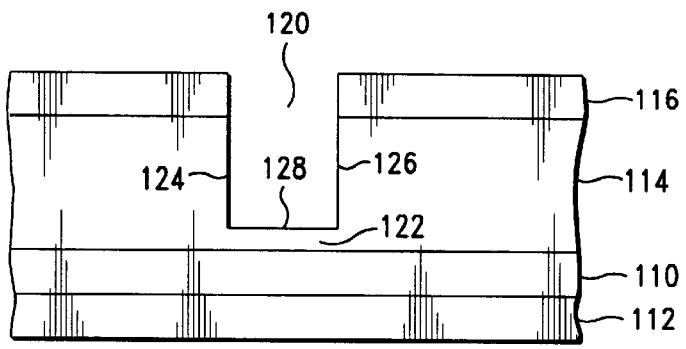

A cavity 120 was anisotropically etched in Si—Ge layer 114, using etch mask 118, see FIG. 1B. In the embodiment depicted in FIG. 1B, cavity 120 does not extend to dielectric layer 110. A portion 122 (FIG. 1B) of Si—Ge layer 114 was maintained between cavity 120 and dielectric layer 110 by executing a timed etch for forming cavity 120. The cavity exhibited optically smooth sidewall surfaces 124 and 126, and an optically smooth bottom surface 128. Cavity 120 was etched using a DPS (decoupled plasma source) etch reactor, which will be described in connection with FIG. 2. The etch parameters of the present invention for etching cavity 120 in Si—Ge layer 114, using a novel $SF_6$(sulfurhexafluoride)/ $C_4F_8$(octafluorocyclobutane) etch chemistry for Si—Ge, as well as the etch results that were obtained are shown in Table A.

TABLE A

| | |
|---|---|
| $SF_6$ Flow (sccm) | 50 |
| $C_4F_8$ Flow (sccm) | 50 |
| Ratio of $SF_6$ Flow/$C_4F_8$ Flow | 1:1 |
| Source Power (W) | 700 |
| Biaspower(W) | 10 |
| Pressure (mT) | 20 |
| Etch rate of layer 114 (Å/min) | 7120 |
| Etch selectivity Silicon/Organic Resist | 7.6 |
| Etch rate uniformity (M-m) | 1.52% |
| Profile angle of trench sidewall (°) | 90 ± 0.5 |
| Sidewall surface roughness (nm) | <4 |

The results shown in Table A demonstrate that the novel etch technique for Si—Ge results in Si—Ge sidewall surfaces that are optically smooth. The results also show that the novel etch technique exhibits a high etch selectivity to organic resist.

Also, it was observed that the gas phase passivation that was obtained with $C_4F_8$ precludes the need to use a high bias power in order to achieve Si—Ge sidewall passivation. Additionally, the relatively low bias power that is employed in the technique of the present invention avoids high temperatures during etching, thus avoiding heat caused degradation of other components of the OEIC structure.

Table B shows suitable ranges of etch parameters of the present invention for etching Si—Ge utilizing a DPS etch reactor to achieve optically smooth Si—Ge surfaces.

TABLE B

| | |
|---|---|
| Ratio of $SF_6$ Flow/$C_4F_8$ Flow | 0.1–10 |
| Source Power (W) | 300–2000 |
| Bias Power (W) | 3–100 |
| Pressure (mT) | 2–50 |

Table C shows advantageous ranges of etch parameters of the present invention to obtain optimal Si—Ge etching results employing a DPS etch reactor.

TABLE C

| | |
|---|---|
| Ratio of $SF_6$ Flow/$C_4F_8$ Flow | 0.5–3.0 |
| Source Power (W) | 500–1000 |
| Bias Power (W) | 3–15 |
| Pressure (mT) | 5–20 |

Additionally, the experimental results indicate that the preferred etch plasma ionization density ranges from about $10^{11}/cm^3$ to about $10^{12}/cm^3$.

Embodiments of the present invention, as illustrated in Tables A–C, include utilizing gas mixtures of $SF_6$ (sulfurhexafluoride) and $C_4F_8$ (octafluorocyclobutane). Additionally, it is contemplated to employ gas mixtures of $SF_6$ and FCs (fluorocarbons) other than $C_4F_8$. Examples of suitable FCs in addition to $C_4F_8$ include hydrofluorocarbons, i.e. hydrocarbons wherein part or all hydrogen atoms have been replaced by fluorine atoms, or by fluorine and chlorine atoms. Suitable hydrofluorocarbons are shown in Table D.

TABLE D

| | |
|---|---|
| $CHF_3$ | trifluoromethane |
| $CHClF_2$ | chlorodifluoromethane |

TABLE D-continued

| | |
|---|---|
| $CHCl_2F$ | dichlorofluoromethane |
| $CH_2F_2$ | difluoromethane |
| $CF_4$ | tetrafluoromethane |
| $CClF_3$ | trichlorofluoromethane |
| $CCl_2F_2$ | dichlorodifluoromethane |
| $CCl_3F$ | trichlorofluoromethane |
| $C_2F_6$ | hexafluoroethane |
| $C_2ClF_5$ | chloropentafluoroethane |
| $C_2Cl_2F_4$ | dichlorotetrafluoroethane |
| $C_3F_6$ | hexafluoropropylene |
| $C_3F_8$ | octafluoropropane |
| $C_4F_6$ | hexafluorobutadiene |
| $C_4F_8$ | octafluorocyclobutane |

Additionally, it is contemplated to utilize gas mixtures of $SF_6$ and two or more FCs. The FCs and FC mixtures can be employed instead of $C_4F_8$ shown in Tables A–C, providing the etch parameters include the parameters shown in Table E.

TABLE E

| | |
|---|---|
| Reactive Gas Mixture | $SF_6$ and one or more fluorocarbon compounds |
| DPS Bias Energy (W) | no greater than about 100 |

The expression "DPS bias energy" as defined herein in connection with Table D includes bias power that is applied to a structure, such as a semiconductor wafer, in a decoupled plasma source reactor.

In addition to the etch parameters shown in Tables A–C and E, it is also contemplated to add an unreactive gas, such as nitrogen or inert gas for example argon, to the etch plasma of the embodiments of the present invention.

Si—Ge cavities that are etched employing the novel etch techniques for forming waveguides are typically etched to a depth of about 5 to 7 μm. The term "cavity" as defined herein includes holes extending partly or completely through a layer such as an IC layer, and trenches or grooves extending partly or completely through a layer such as an IC layer.

Resist layer 116, depicted in FIG. 1B, is removed from the OEIC structure employing conventional techniques that are well known to a person of ordinary skill in the art. Polymer, if any, that has formed on the walls and the bottom of cavity 120 can be removed using for example a conventional $H_2SO_4/H_2O_2$ bath or employing a plasma including $CF_4/O_2$/HBr.

Figure 1C:
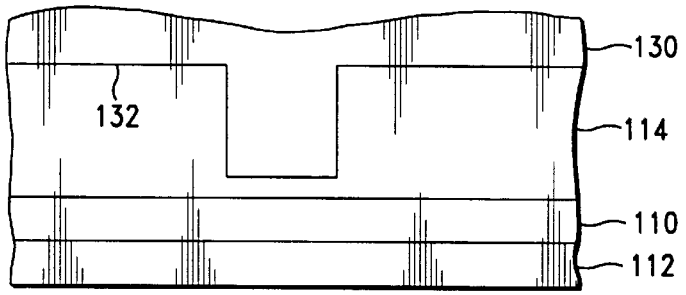

As illustrated in FIG. 1C, cavity 120 is filled with a conformal layer 130 of a second Si—Ge composition through epitaxial deposition. Layer 130 is also deposited on exposed top surface 132 of Si—Ge layer 114. The material of the second Si—Ge composition is selected such that it has a higher refractive index than the material of the first Si—Ge composition. Subsequently, Si—Ge layer 130 is removed from surface 132 of layer 114, for example using conventional CMP (chemical mechanical polishing), or using a conventional etch back process, to define a core 134 of the second Si—Ge composition that has been formed in cavity 120, see FIG. 1D.

Figure 1D:
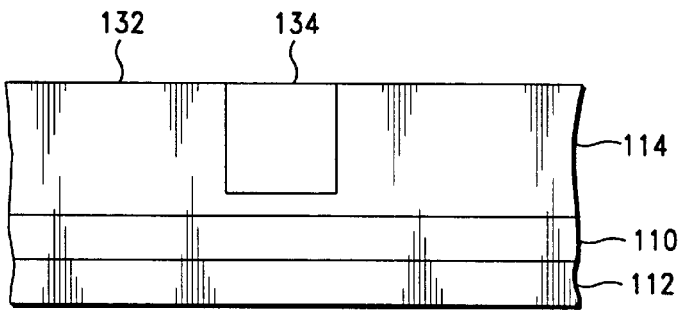
Figure 1E:
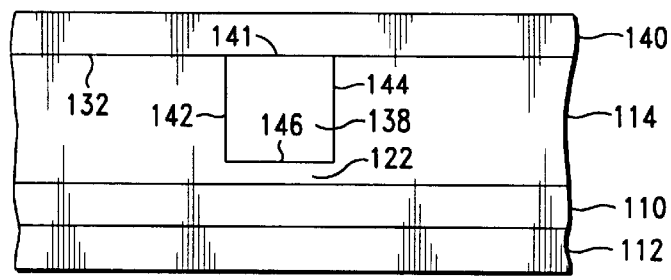

In a final layer deposition step, as depicted in FIG. 1E, a top cladding layer 140 of epitaxial Si is deposited on the top surface of the core, and on surface 132 of Si—Ge layer 114, thereby forming a waveguide 138. Top surface 141 (FIG. 1E) of Si—Ge waveguide 138 is covered with epitaxial Si, while side surfaces 142 and 144 and bottom surface 146 of the waveguide are covered with Si—Ge layer 114. Si—Ge waveguide 138 is thus embedded within epitaxial Si and within Si—Ge having a lower refractive index than the waveguide. Due to the novel etch technique, the side and bottom surfaces of waveguide 132 are optically smooth resulting in optimal light transmission. However, some light propagation losses may occur due to some light scattering at the top surface of the waveguide since this surface, contacting the epitaxial Si, does not exhibit the high degree of smoothness that is typical of the side and bottom surfaces of waveguide 138 that are prepared according to the present invention.

It will be noted that the embodiments of the present invention that are described in connection with FIGS. 1A–1E are not limited to fabricating only one Si—Ge waveguide in an Si—Ge layer 114. The invention is equally operable when multiple cavities, similar to cavity 120 (FIG. 1B) are anisotropically etched in Si—Ge layer 114. These multiple cavities can be etched simultaneously or sequentially and can then be filled simultaneously with a suitable Si—Ge material.

Suitable Si—Ge compositions for fabricating optically smooth surfaces and for fabricating Si—Ge waveguides employing the techniques of the present invention, include a Ge content ranging from about 3 mole % to about 5 mole %.

A variety of dielectric materials are suitable for dielectric layer 110 (FIGS. 1A–1E). These materials include oxides such as PECVD (plasma-enhanced chemical vapor deposition) $SiO_2$ and F—$SiO_2$, and partially oxidized organo silane materials containing at least 1% of carbon by atomic weight, which are known a BLACK DIAMOND™ and which are available from Applied Materials, Inc., located in Santa Clara, Calif. Suitable dielectric materials also include: polymers, for example amorphous fluorinated carbon based materials, spin-on dielectric polymers such as fluorinated and non-fluorinated poly(arylene) ethers (commercially known as FLARE 1.0 and 2.0, which are available from Allied Signal Company), poly(arylene) ethers (commercially known as PAE 2–3, available from Schumacher Company), divinyl siloxane benzocyclobutane (DVS-BCB) or similar products and aero-gel. These dielectric materials are well known to those of ordinary skill in the art.

Figure 2:
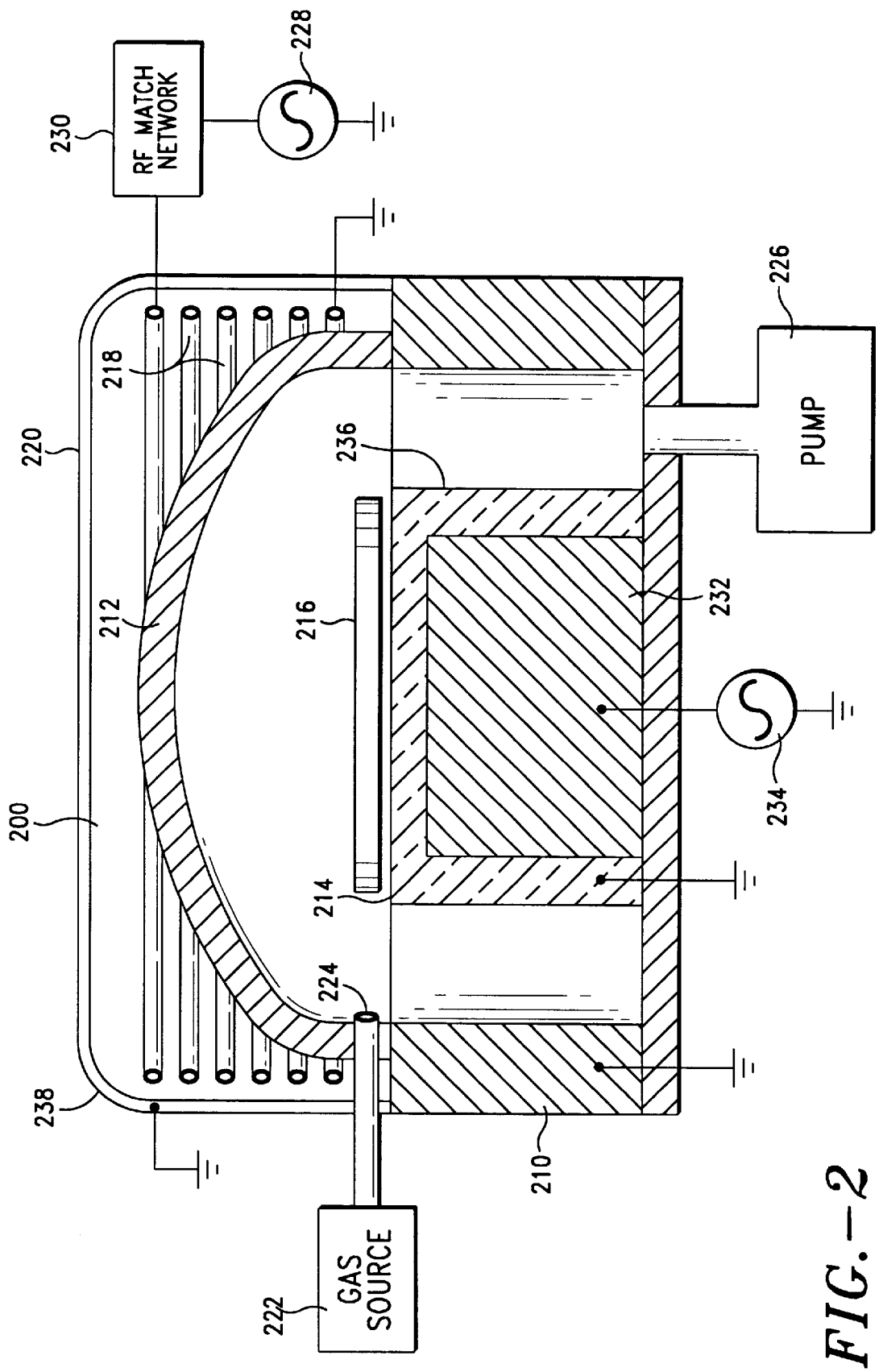
FIG. 2 is a schematic partial view of a conventional decoupled plasma source etch reactor for executing the etch techniques of the present invention.

Etching of cavity 120 (FIG. 1B) was conducted using a polysilicon decoupled plasma source (Poly DPS) chamber mounted on a Centura® platform, available from Applied Materials, Inc., Santa Clara, Calif. This type of etch reactor is schematically illustrated in FIG. 2 as follows. An inductively coupled RF plasma reactor includes a reactor chamber 200 having a grounded conductive cylindrical sidewall 210 and a dielectric ceiling 212. The reactor further includes a wafer pedestal 214 for supporting a semiconductor wafer 216 in the center of the chamber, a cylindrical inductor coil 218 surrounding an upper portion of the chamber beginning near the plane of the top of the wafer pedestal 214 and extending upwardly therefrom toward top 220 of the chamber. A processing gas source 222 and gas inlet 224 for furnishing a processing gas into the chamber interior, and a pump 226 for controlling the chamber pressure are provided, as illustrated in FIG. 2. The coil inductor 218 is energized by a plasma source power supply or RF generator 228 through a conventional active RF match network 230, the top winding of the coil inductor 218 being "hot" and the bottom winding being grounded. The wafer pedestal 214 includes an interior conductive portion 232 connected to a bias RF power supply or generator 234 and an exterior grounded conductor 236 (insulated from the interior conductive portion 232). A conductive grounded RF shield 238 surrounds the coil inductor 218.

Figure 3A:
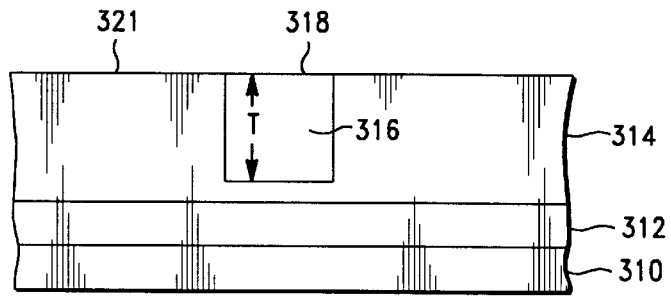
FIGS. 3A–3D are cross sectional views illustrating another embodiment of the present invention at sequential stages.
Figure 3B:
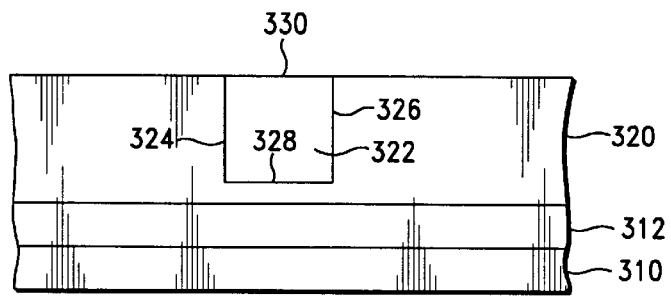

As noted in connection with FIG. 1E, waveguide 138 exhibits optically smooth side and bottom surfaces, but top surface 141 of this waveguide lacks an optically smooth surface because top surface 141 contacts the epitaxial Si top cladding layer. However, the novel techniques of the present invention can be utilized to fabricate a waveguide wherein the top surface is provided with an optically smooth surface as illustrated in FIGS. 3A–3D. FIG. 3A depicts a structure, similar to the structure shown in FIG. 1D, comprising a substrate 310 such as epitaxial Si, a bottom cladding layer 312 including a dielectric material, a layer 314 of a first Si—Ge composition and a core 316 of a second Si—Ge composition. The material of the second Si—Ge composition is selected such that it has a higher refractive index than the first Si—Ge composition. Si—Ge core 316 (FIG. 3A) and Si—Ge layer 314 include exposed top surfaces 318 and 319 respectively. In a next processing step, exposed Si—Ge top surfaces 318 and 319 are then etched employing etch parameters of the present invention similar to those provided in Tables A–E. The etch procedure results in lowering the thickness of layer Si—Ge layer 314, thus resulting in Si—Ge layer 320 as depicted in FIG. 3B. Similarly, Si—Ge core 316 thickness T depicted in FIG. 3A is reduced due to the etching procedure, resulting in core 322 shown in FIG. 3B. Core 322 includes side surfaces 324, 326, bottom surface 328 and exposed top surface 330. This etch procedure results in an optically smooth top surface 330 of core 322.

Figure 3C:
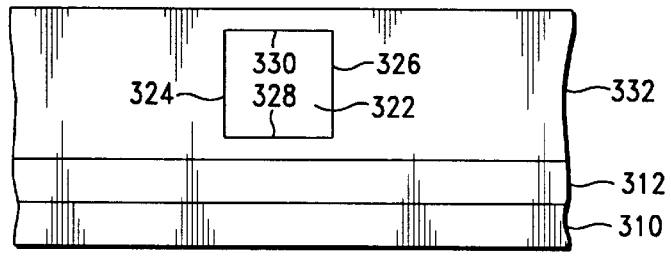
Figure 3D:
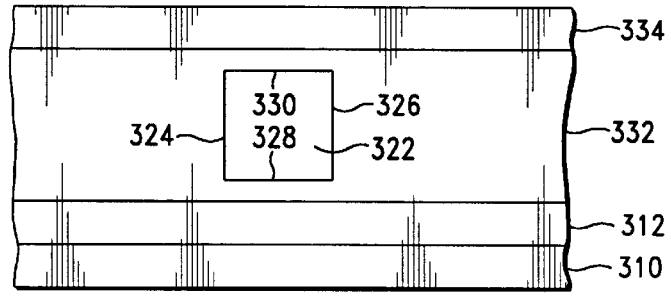

As illustrated in FIG. 3C, an additional layer of the first Si—Ge composition (i.e. the same composition as layer 320) is deposited on the exposed top surfaces of layer 320 and core 322 thereby increasing the thickness of layer 320 (FIG. 3B), thus resulting in Si—Ge layer 332 that encloses the top, side and bottom surfaces of core 322, see FIG. 3C. Subsequently, as shown in FIG. 3D a layer 334 of epitaxial Si is deposited on Si—Ge layer 332. The OEIC structure depicted in FIG. 3D, includes a Si—Ge waveguide 322 having optical smooth top, side and bottom surfaces 330, 324, 326 and 328 respectively that are embedded within Si—Ge layer 332.

Figure 4D:
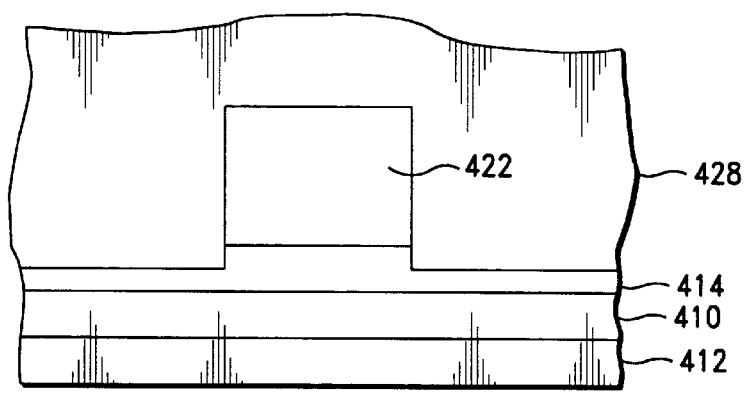

The etch techniques of the present invention are equally operable where Si—Ge optical surfaces or waveguides are fabricated by means of substratively etching an Si—Ge layer as illustrated in FIGS. 4A–4F. As shown in FIG. 4A, a bottom cladding layer 410 including dielectric material, such as silicon oxide, is formed on a substrate 412 such as epitaxial Si. Layers 410 and 412 are similar to layers 110 and 112 respectively (FIG. 1A). Returning to FIG. 4A, a layer 414 of a first Si—Ge composition is then deposited on the planarized surface of bottom cladding layer 410. The surface of Si—Ge layer 414 is planarized. The surface of Si—Ge layer 414 is then etched employing the $SF_6$/fluorocarbon etch techniques of the present invention in order to obtain an optically smooth surface. Subsequently, a layer 416 of a second Si—Ge composition is deposited on Si—Ge layer 414, wherein the second Si—Ge composition has a higher refractive index than the first Si—Ge composition, i.e. layer 414. After planarizing the surface of Si—Ge layer 416, a layer 418 of conventional organic photoresist is deposited on Si—Ge layer 416. Resist layer 418 is developed to form a subtractive etch mask 420, as shown in FIG. 4B. Mask 420 is then utilized for substractively anisotropically etching Si—Ge layer 416, see FIG. 4C, using the etch parameters shown in Table A. The etch procedure of the embodiment of the present invention illustrated in FIG. 4C preferably utilizes over-etching layer 416 partly into Si—Ge layer 414, i.e. past bottom surface 421 of newly formed Si—Ge core 422. Over-etching layer 416 ensures a complete formation of side surfaces 424 and 426 of core 422. Optically smooth side surfaces 424 and 426 are obtained with the etch procedures of the present invention. Alternatively (not shown), anisotropical etching of layer 414 can be continued to layer 410, if layer 410 comprises a material that has a relatively high etch selectivity to the etch parameters of the present invention. For example, layer 410 can be an effective etch stop when layer 410 comprises polymeric materials. However, this alternative procedure might make it more difficult to subsequently remove the resist mask without degrading polymeric layer 410.

Figure 4E:
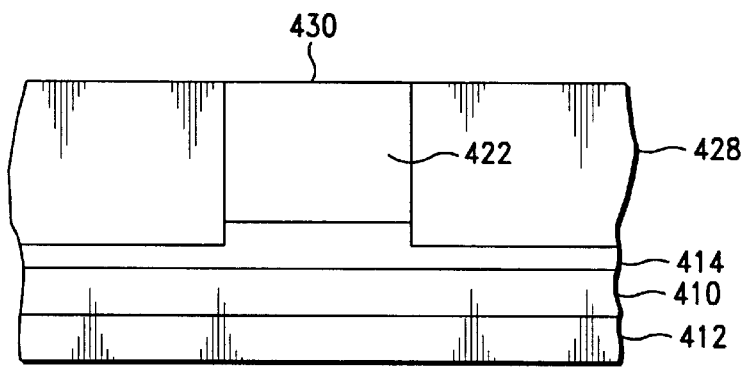
Figure 4F:
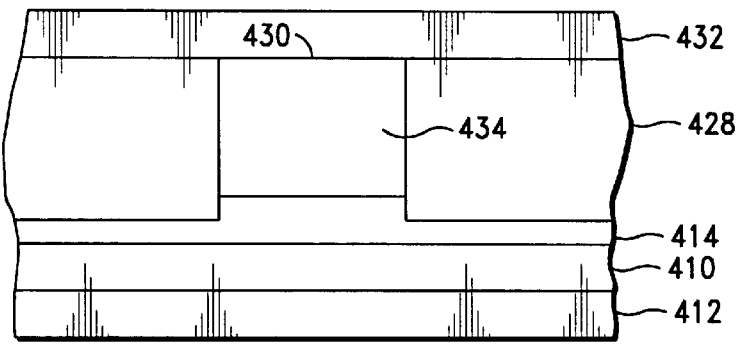

As shown in FIG. 4D, etch mask 420 is removed and any polymer that is formed on the exposed Si—Ge surfaces can be removed using the methods described in connection with FIG. 1B. Returning to FIG. 4D, a conformal layer 428 of the first Si—Ge composition, i.e. the same composition as layer 414, is deposited on the OEIC structure. Excess layer 428 material is then removed from the structure, as depicted in FIG. 4E, exposing top surface 430 of Si—Ge core 422. Optionally, an etch back step using the etch chemistries of the present invention can be employed to obtain an optically smooth top surface of the Si—Ge core. Finally, a top cladding layer 432 of, for example epitaxial Si, is deposited on Si—Ge layer 428 and top surface 430 of the core, see FIG. 4F, thus forming a waveguide 434 that is embedded within epitaxial Si at the top surface of the waveguide and within first Si—Ge composition layers 414 and 428 at the side and bottom surfaces of waveguide 434. It will be noted that the bottom and side surfaces of waveguide 434 are optically smooth, as described in connection with FIGS. 4A and 4C.

Embodiments of the present invention typically include depositing a layer of Si—Ge material on a bottom cladding layer. However, the present invention is equally operable when the Si—Ge layer is deposited on a substrate such as an IC structure or an OEIC structure. The expression "IC structure", as defined herein, includes completely formed IC structures and partially formed IC structures, and also including semiconductor wafers.

As described above, waveguides of the present invention comprise a Si—Ge material that is formed in a layer of another Si—Ge material, such that the waveguide material has a higher refractive index than the layer material. However, both materials have a very similar, but not identical, composition. The close similarity between these materials results in desirable highly similar chemical and physical properties, for example providing the same thermal expansion coefficient and the same mechanical properties. Consequently, these waveguides exhibit a high degree of reliability during manufacturing as well as during use of the OEIC circuit. Also, the low bias power utilized in the novel etch techniques avoids heat caused degradation of the OEIC structure that could otherwise result from fabricating the waveguides.

During IC or OEIC fabrication it is desirable to perform a sequence of processing steps while maintaining the IC structure in a vacuum environment. For example, in a sequence of plasma etching that is followed by PVD (physical vapor deposition) it is desirable to maintain the OEIC structure in a vacuum environment in order to minimize, or avoid if possible, physical and/or chemical changes in the etched surface prior to PVD. Also, keeping the OEIC structure in a vacuum environment minimizes particle contamination of the etched surface. A cluster tool can be utilized to execute a number of sequential processing steps, such as etching and PVD, in IC or OEIC fabricating chambers, reactors or tools that share a common environment, such as vacuum, and that provide IC or OEIC structure transport between the fabricating chambers while maintaining the structure in the common environment. It is well known to persons of ordinary skill in the art that a cluster tool provides a process module wherein all of the components of a particular processing step are integrated through robots and wherein automatic logging of IC structures can be provided, see R. Zorich, *Handbook Of Quality Integrated Circuit Manufacture*, Academic Press, Inc., pp. 545, 546, 1991. A cluster wherein two or more sequential microchip fabrication processes are performed is referred to as integrated processing, see P. Van Zant, *Microchip Fabrication*, McGraw-Hill, 4$^{th}$ ed., pp. 481, 482, 2000. Also, it is known to provide techniques for producing schedules of the order in which the chambers of a cluster tool are utilized by a given semiconductor wafer, see for example U.S. Pat. No. 6,201,999 B1 (Jevtic, 2001).

Figure 5:
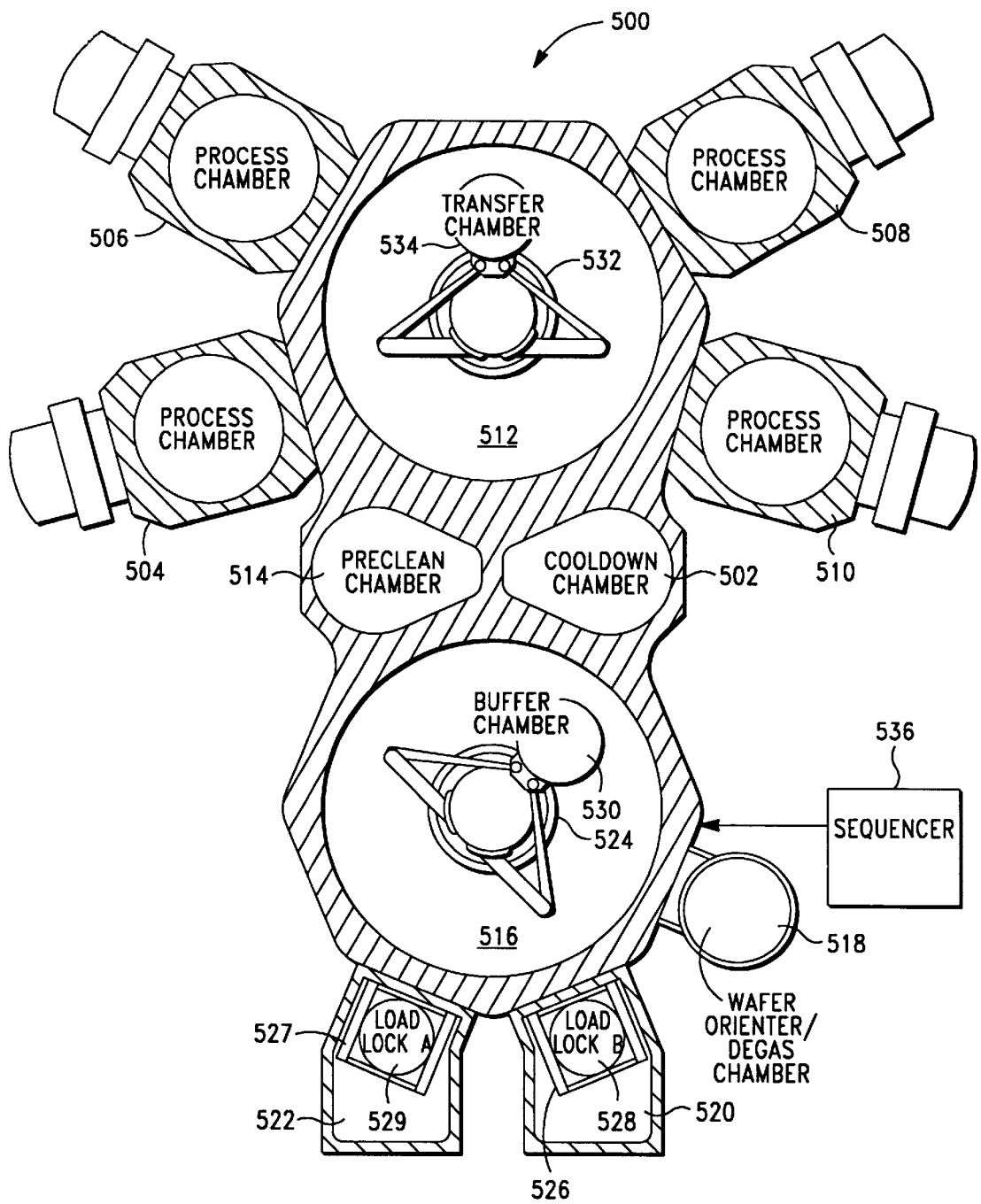
FIG. 5 is a schematic partial view of a conventional cluster tool for executing processing steps of the present invention.

It is contemplated to execute certain processing steps of the novel technique in a cluster tool, similar to for example the cluster tool known as the Endura® system manufactured by Applied Materials, Inc. of Santa Clara, Calif. As schematically illustrated in FIG. 5, an exemplary cluster tool 500 includes, for example, four process or fabricating chambers 504, 506, 508, 510, a transfer chamber 512, a preclean chamber 514, a buffer chamber 516, a wafer orienter/degas chamber 518, a cooldown chamber 502, and a pair of loadlock chambers 520 and 522. Processing steps of the present invention can, for example, be performed in illustrative cluster tool 500 as follows: (1) etching in chamber 504, (2) photoresist removal in chamber 510, (3) Si—Ge deposition in chamber 506 and (4) top cladding deposition in chamber 508. These processing steps, as executed by means of cluster tool 500, will be more filly described in connection with Table F. The buffer chamber 516 is centrally located with respect to the loadlock chambers 520 and 522, the wafer orienter/degas chamber 518, the preclean chamber 514 and the cooldown chamber 502. To effectuate OEIC structure transfer amongst these chambers, the buffer chamber 516 contains a first robotic transfer mechanism 524. OEIC structure 528 is typically transferred from storage to the system in a transport cassette 526 that is placed within loadlock chamber 520. The robotic transport mechanism 524 transports the structure 528 from cassette 526 to any of the three chambers 518, 502, or 514. Typically, a given OEIC structure is first placed in the wafer orienter/degas chamber 518, them moved to the preclean chamber 514. The cooldown chamber 502 is generally not used until after the wafer is processed within the process chambers 504, 506, 508, 510. Individual OEIC structures are carried upon a transport blade 530 that is located at the distal end of the first robotic mechanism 524. The transport operation can be controlled by a sequencer 536.

The transfer chamber 512 (FIG. 5) has access to the four process chambers 504, 506, 508 and 510 as well as the preclean chamber 514 and the cooldown chamber 502. To effectuate transport of a structure amongst the chambers, the transfer chamber 512 contains a second robotic transport mechanism 532. The mechanism 532 has a transport blade 534 attached to its distal end for transporting the individual OEIC structures. In operation, the transport blade 534 of the second transport mechanism 532 retrieves an OEIC structure from the preclean chamber 514 and transfers that structure to the first stage of processing, for example, etching within chamber 504. Once the structure has been processed in chamber 504, the OEIC structure can be transported to for example chamber 510, and so on. Following completion of processing within the process chambers, the transport mechanism 532 moves the OEIC structure from the process chamber and transports the structure to the cooldown chamber 502. The structure is then removed from the cooldown chamber using the first transport mechanism 524 within the buffer chamber 516. Lastly, the processed OEIC structure 529 is placed in the transport cassette 527 within the loadlock chamber 522.

A cluster tool such as exemplary cluster tool 500, illustrated in FIG. 5, can be employed to execute processing steps of the novel techniques for fabricating Si—Ge waveguides of the present invention as follows. A first OEIC structure is fabricated, such that the structure provides a stack including a substrate layer, upon which is deposited a bottom cladding layer, followed by a layer of a first Si—Ge composition upon which a photoresist etch mask for etching a cavity is formed. Cluster tool 500 is then employed such that a vacuum environment is maintained during each of the transfers of the OEIC structure inside the cluster tool. Table F shows exemplary processing steps of the present invention as contemplated for execution in cluster tool 500.

TABLE F

| Chamber | Processing Step |
|---|---|
| 504 | etching the first OEIC structure utilizing the etch techniques of the present invention for etching a cavity in the layer of a first Si—Ge composition by employing a plasma comprising a gas mixture including $SF_6$ and one or more fluorocarbons, wherein the cavity has optically smooth bottom and side surfaces, and wherein the cavity does not extend to the underlying bottom cladding layer, thereby forming a second OEIC structure similar to the structure illustrated in FIG. 1B |
| 510 | removing the resist from the second OEIC structure, thereby forming a third OEIC structure |
| 506 | depositing a conformal layer of a second Si—Ge composition on the third OEIC structure, wherein the second Si—Ge composition has a higher refractive index than the first Si—Ge composition, thereby forming a fourth OEIC structure similar to the structure illustrated in FIG. 1C |
| 504 | etching the fourth OEIC structure, employing an etch back process, to define a core of the second Si—Ge composition in the layer of the first Si—Ge composition, thereby forming a fifth OEIC structure similar to the structure illustrated in FIG. 1D |
| 508 | depositing a top cladding layer on the fifth OEIC structure, thereby forming a sixth OEIC structure similar to the structure illustrated in FIG. 1E, forming a waveguide having a core comprising the second Si—Ge composition and having optically smooth bottom and side surfaces that are embedded within the first Si—Ge composition |

The OEIC fabricating process shown in Table F illustrates a sequence of etching and deposition steps of the present invention, wherein the OEIC structure is maintained in a vacuum environment thus minimizing, or avoiding, the possible degradation of etched surfaces resulting form breaking vacuum prior to a subsequent layer deposition on the etched surface.

Additionally, it is contemplated to employ cluster tool 500, depicted in FIG. 5, and executing a modification of the processing steps shown in Table F as follows. Employing chamber 504 for etching the fourth OEIC structure by employing an etch back process using the etch techniques of the present invention, to define a core of the second Si—Ge composition in the layer of the first Si—Ge composition, thereby forming a seventh OEIC structure including a core having an optically smooth top surface similar to the structure illustrated in FIG. 3B. Subsequently, employing chamber 506 for depositing a layer of the first Si—Ge composition on the seventh structure, thereby forming an eighth OEIC structure including a waveguide that is completely embedded in the first Si—Ge composition, and having optically smooth top, bottom and side surfaces similar to the structure illustrated in FIG. 3C. Then, employing chamber 508 for depositing a top cladding layer on the eighth structure, thereby forming a structure similar to the structure illustrated in FIG. 3D. Optionally, chamber 508 can be employed for depositing a top cladding layer on the seventh structure, thereby forming a structure wherein the core top surface is covered with the top cladding layer, while the core bottom and side surfaces are optically smooth surfaces that are embedded within the first Si—Ge composition.

Figure 6:
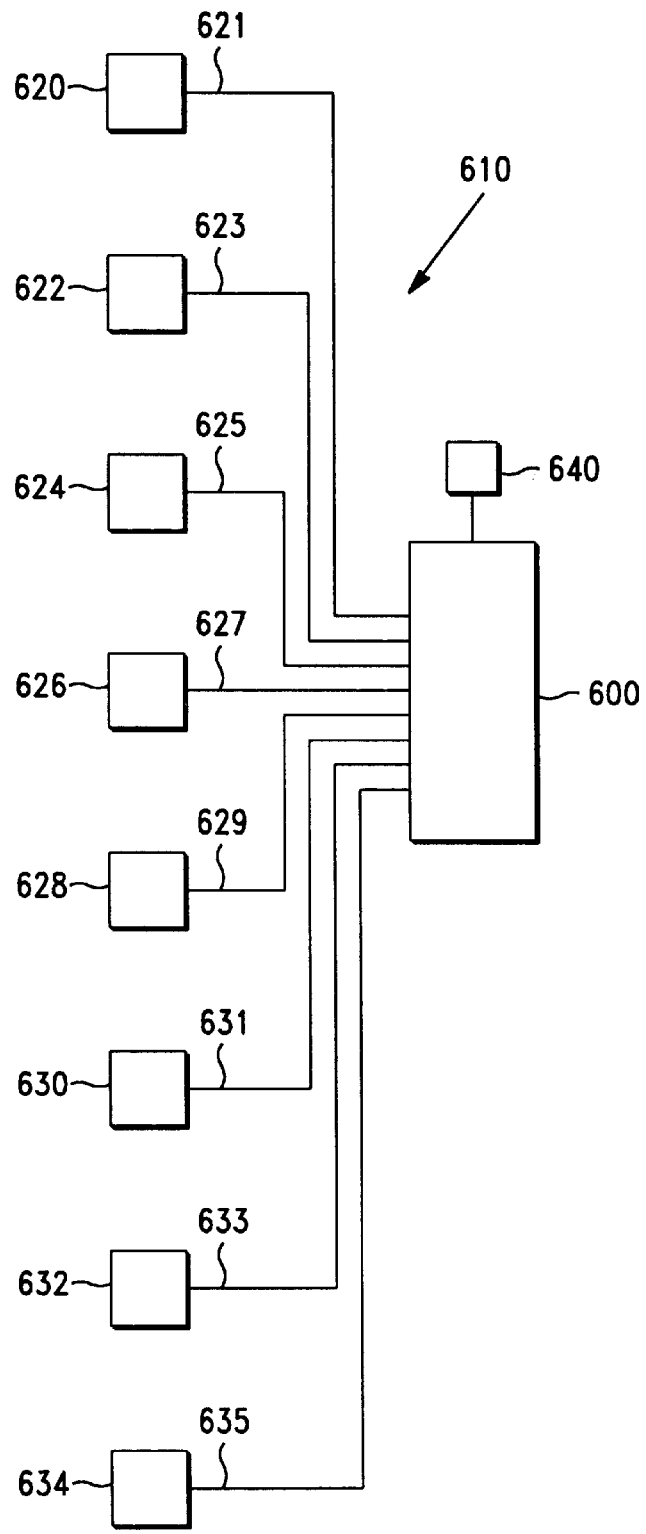
FIG. 6 is a block diagram illustrating a manufacturing system for fabricating waveguides of the present invention.

The fabrication techniques of the present invention for forming an Si—Ge waveguide require a sequence of processing steps. Each processing step can be performed at a fabrication station. All or some of the fabrication stations and their respective processing steps can be integrated by means of a novel apparatus including a controller 600 illustrated in FIG. 6. Controller 600 is adapted for controlling a number of fabrication stations that are utilized in the formation of fabricated structures, such as the OEIC structures described in connection with FIGS. 1A–1E. As illustrated in FIG. 6, a novel manufacturing system 610 for fabricating OEIC structures includes controller 600 and a plurality of fabrication stations: 620, 622, 624, 626, 628, 630, 632 and 634. Additionally, system 610 has operative links 621, 623, 625, 627, 629, 631, 633 and 635 that provide connections between controller 600 and fabrication stations 620, 622, 624,626, 628, 630, 632 and 634 respectively. The novel apparatus includes a data structure such as a computer program that causes controller 600 to control the processing steps at each of the fabrication stations and to, optionally, regulate the sequence in which fabrication stations are used in order to form the novel structures.

Examples of suitable controllers include conventional computers and computer systems including one or more computers that are operably connected to other computers or to a network of computers or data processing devices. Suitable computers include computers commonly known as personal computers. The data structure that is used by controller 600 can be stored on a removable electronic data storage medium 640 (FIG. 6) such as computer floppy disks, removable computer hard disks, magnetic tapes and optical disks, to facilitate the use of the same data structure at different manufacturing locations. Alternatively, the data structure can be stored on a non-removable electronic data storage medium, including a medium positioned at a location that is remote (not shown) from controller 600, using such data storage devices as are well known to those of ordinary skill in the art. The data structure can be communicated from a remote location to controller 600 using communicating techniques which are well know to those of ordinary skill in the art including hard wire connections, wireless connections and data communication methods utilizing one or more modems or techniques using one or more computers commonly known as servers. The data storage medium can be operably connected to the controller using methods and device components which are well known to those of ordinary skill in the art. Examples of suitable fabrication stations for manufacturing system 610 include the stations shown in Table G.

TABLE G

| Station | Processing Step |
|---|---|
| 620 | depositing bottom cladding layer on a substrate |
| 622 | depositing a layer of a first Si—Ge composition on the bottom cladding layer |
| 624 | depositing an organic photoresist layer on the first Si—Ge composition layer |
| 626 | forming a cavity etch mask in the photoresist layer |
| 628 | anisotropically etching a cavity in the first Si—Ge composition, wherein the cavity does not extend to the bottom cladding layer and wherein etching includes employing a plasma comprising a mixture of $SF_6$ and one or more fluorocarbon compounds |
| 630 | removing the resist layer |
| 632 | depositing a second Si—Ge composition in the cavity, wherein the second Si—Ge composition has a higher refractive index than the first Si—Ge composition |
| 634 | depositing a top cladding layer on the second Si—Ge material that is deposited in the cavity, whereby an Si—Ge waveguide is formed. |

Additional fabrication stations can be added to manufacturing system 610, for example one or more planarizing stations. The sequence of processing steps shown in Table G is illustrative of system 610. However, the invention is equally operable in systems wherein a controller, such as controller 600, causes the sequence to be altered, for example by repeating a previously executed processing step if test results indicate that this processing step should be partly or completely repeated. Alternatively, the process sequence which is controlled by a controller such as controller 600, can include processing steps such as surface preparation which may be performed following any of the fabrication stations shown in FIG. 6 and Table G. It is also contemplated that one or more fabrication stations can be positioned at a location that is remote from the other fabrication stations in which case an additional controller or a network of controllers can be employed to control the remotely located manufacturing station.

As illustrated in FIG. 6, controller 600 is adapted to be connected to each of the manufacturing stations through operative links. Each of these links provides a bidirectional connection enabling controller 600 to transfer commands from its data structure, such as specific operating parameters, and to receive information such as test data, from the fabrication station. The operative links can be in the form of hard wire connections or wireless connections.

The invention has been described in terms of exemplary embodiments of the invention. One skilled in the art will recognize that it would be possible to construct the elements of the present invention from a variety of means and to modify the placement of components in a variety of ways. While the embodiments of the invention have been described in detail and shown in the accompanying drawings, it will be evident that various further modifications are possible without departing from the scope of the invention as set forth in the following claims.

We claim:

1. A method of plasma etching an etch pattern through a layer of an Si—Ge material positioned inside an etch reactor, wherein the etch pattern provides an aperture exposing the layer, the method comprising anisotropically etching the layer with a plasma including:

a) $SF_6$ (sulfurhexafluoride) gas flowing at a flow rate F1; and b) fluorocarbon gas flowing at a flow rate F2.

2. The method of claim 1 wherein the fluorocarbon gas comprises one or more hydrofluorocarbons.

3. The method of claim 1 wherein the fluorocarbon gas comprises octafluorocyclobutane.

4. The method of claim 1 wherein the plasma additionally comprises an inert gas.

5. The method of claim 1 further comprising plasma at an F1/F2 flow rate ratio ranging from about 0.1 to about 10.

6. The method of claim 1 wherein the F1 flow rate is substantially equal to the F2 flow rate.

7. The method of claim 1 wherein the plasma additionally comprises a plasma ionization density ranging from about $10^{11}/cm^3$ to about $10^{12}/cm^3$.

8. The method of claim 1, wherein the etch reactor comprises a DPS (decoupled plasma source) reactor.

9. The method of claim 1 wherein the etch mask is provided in an organic photoresist and wherein the method of etching comprises an etch selectivity of about 7 to the organic photoresist.

10. An etch method of fabricating an optically smooth Si—Ge surface, in an Si—Ge layer, the method comprising anisotropically etching the Si—Ge layer with a plasma including (1) a mixture of $SF_6$ and $C_4F_8$ (octafluorocyclobutane) and (2) plasma conditions including a DPS bias energy no greater than about 100 W, wherein an optically smooth surface is formed on a plasma etched surface of the Si—Ge layer.

11. The method of claim 10 additionally comprising an etch mask that is provided in an organic photoresist and wherein the method of etching includes an etch selectivity of about 7 to the organic resist.

12. The method of claim 10 wherein the optically smooth surface includes a surface smoothness <4 nm.

13. A method of fabricating an Si—Ge waveguide on a substrate, the method comprising:
a) depositing a layer of a first Si—Ge composition on the substrate;
b) depositing a photoresist layer on the first Si—Ge composition layer;
c) forming a cavity etch mask in the photoresist layer;
d) anisotropically etching a cavity in the first Si—Ge composition layer such that the cavity does not extend to the substrate, wherein etching includes employing a plasma comprising a gas mixture of (1) $SF_6$ at a flow rate F1, and (2) one or more fluorocarbon compounds at a combined flow rate F2;
e) removing the resist layer;
f) depositing a conformal layer of a second Si—Ge composition in the cavity and on the first Si—Ge composition layer, wherein the second Si—Ge composition comprises a higher refractive index than the first Si—Ge composition;
g) removing excess conformal layer, thereby forming a core comprising the second Si—Ge composition; and
h) depositing a top cladding layer on the core, thereby forming the Si—Ge waveguide.

14. The method of claim 13 wherein anisotropically etching a cavity is executed in a DPS etch reactor employing a DPS bias power no greater than about 100 W.

15. The method of claim 13 wherein the one or more fluorocarbon compounds comprise hydrofluorocarbon compounds.

16. The method of claim 13 wherein the first and second Si—Ge compositions each comprise a Ge content ranging from about 3 mole % to about 5 mole %.

17. The method of claim 13 wherein (1) the substrate comprises a dielectric material and (2) the top cladding layer comprises epitaxial Si.

18. The method of claim 13 wherein the waveguide is fabricated in an opto-electronic integrated circuit structure.

19. A waveguide formed according to the method of claim 13.

20. An opto-electronic integrated circuit structure fabricated according to the method of claim 18.

21. A method of fabricating an Si—Ge waveguide, the method comprising:
a) forming a first structure including a top layer of a first Si—Ge composition having a layer thickness T;
b) selecting a cluster tool for processing the first structure, wherein (1) the cluster tool includes at least an etch chamber and at least a deposition chamber, and (2) the cluster tool maintains a vacuum environment;
c) inserting the first structure into the vacuum environment of the cluster tool;
d) employing the etch chamber for anisotropically etching a cavity in the first Si—Ge composition layer of the first structure such that the cavity has a depth D wherein D<T, and wherein etching includes employing a plasma comprising a gas mixture including $SF_6$ and one or more hydrofluorocarbon compounds, thereby forming a second structure having an etched surface; and
e) depositing a conformal layer of a second Si—Ge composition on the etched surface that is formed on the second structure, wherein the second Si—Ge composition has a higher refractive index than the first Si—Ge composition, thereby forming a fourth structure that is adapted for fabricating a waveguide.

22. A method of fabricating an Si—Ge waveguide, the method comprising:
a) forming a first structure comprising: (1) a substrate, (2) a layer of a first Si—Ge composition that is deposited on the substrate and (3) a photoresist etch mask that is formed on the layer of the first Si—Ge composition;
b) selecting a cluster tool comprising (1) an etch chamber, (2) a photoresist removal chamber, (3) at least a first deposition chamber and (4) at least a second deposition chamber;
c) operating the cluster tool such that a vacuum environment is maintained within the cluster tool;
d) inserting the first structure into the vacuum environment of the cluster tool;
e) without breaking vacuum, transferring the first structure to the etch chamber;
f) anisotropically etching a cavity in the first Si—Ge composition layer of the first structure such that the cavity does not extend to the substrate, wherein etching includes employing a first plasma comprising a first gas mixture including (1) $SF_6$ at a flow rate F1, and (2) one or more hydrofluorocarbon compounds at a combined flow rate F2, thereby forming a second structure;
g) without breaking vacuum, transferring the second structure to the photoresist removal chamber;
h) removing the photoresist etch mask, thereby forming a third structure;
i) without breaking vacuum, transferring the third structure to the at least first deposition chamber;
j) depositing a conformal layer of a second Si—Ge composition on the third structure, wherein the second Si—Ge composition has a higher refractive index than the first Si—Ge composition, thereby forming a fourth structure;
k) without breaking vacuum, transferring the fourth structure to the etch chamber;

l) etching the fourth structure, employing an etch back process, to define a core of the second Si—Ge composition in the layer of the first Si—Ge composition, thereby forming a fifth structure;

m) without breaking vacuum, transferring the fifth structure to the at least second deposition chamber; and n) depositing a top cladding layer on the fifth structure, thereby forming a waveguide.

23. The method of claim 22 wherein employing an etch back process comprises employing a second plasma comprising a second gas mixture including $SF_6$ and one or more hydrofluorocarbon compounds.

24. A method of fabricating an Si—Ge waveguide on a substrate, the method comprising:

a) depositing a first layer of a first Si—Ge composition on the substrate;

b) depositing a photoresist layer on the first layer of the first Si—Ge composition;

c) forming a cavity etch mask in the photoresist layer;

d) anisotropically etching a cavity in the first layer of the first Si—Ge composition such that the cavity does not extend to the substrate, wherein anisotropically etching includes employing a plasma comprising a gas mixture including (1) $SF_6$ at a flow rate F1 and (2) a first group of one or more fluorocarbon compounds at a combined flow rate F2;

e) removing the resist layer;

f) depositing a conformal layer of a second Si—Ge composition in the cavity and on the first layer of the first Si—Ge composition, wherein the second Si—Ge composition comprises a higher refractive index than the first Si—Ge composition;

g) removing excess conformal layer, thereby forming (1) a core comprising the second Si—Ge composition wherein the core has an exposed top surface and (2) an exposed top surface of the first layer of the first Si—Ge composition;

h) etching the exposed top surface of the core and the exposed top surface of the first layer of the first Si—Ge composition, wherein etching the top surfaces includes employing a plasma comprising a second gas mixture comprising $SF_6$ and a second group of one or more fluorocarbon compounds, thereby obtaining (1) an etched top surface of the first layer of the first Si—Ge composition and (2) an optically smooth etched top surface of the core; and i) depositing a second layer of the first Si—Ge composition on the etched top surfaces of the core and on the first layer of the first Si—Ge composition, thereby forming the Si—Ge waveguide.

25. The method of claim 24 wherein the one or more fluorocarbon compounds comprise hydrofluorocarbon compounds.

26. The method of claim 24 wherein the plasma additionally comprises a plasma ionization density ranging from about $10^{11}/cm^3$ to about $10^{12}/cm^3$.

27. The method of claim 24 wherein the waveguide is fabricated in an opto-electronic integrated circuit.

28. An opto-electronic integrated circuit structure fabricated according to the method of claim 27.

29. A method of fabricating an Si—Ge waveguide on a substrate, the method comprising:

a) depositing a first layer of a first Si—Ge composition on the substrate;

b) etching the surface of the first layer of the first Si—Ge composition employing a first plasma including a first gas mixture comprising $SF_6$ and one or more hydrofluorocarbons;

c) depositing a layer of a second Si—Ge composition on the first layer of the first Si—Ge composition, wherein the second Si—Ge composition has a higher refractive index than the first Si—Ge composition;

d) depositing a photoresist layer on the layer of the second Si—Ge composition;

e) developing a subtractive etch mask in the photoresist layer that is adapted for subtractively etching the layer of the second Si—Ge composition to fabricate a waveguide core;

f) subtractively anisotropically etching the layer of the second Si—Ge composition, and extending the etching at least until the first layer of the first Si—Ge composition, wherein anisotropically etching comprises employing a second plasma including a second gas mixture comprising $SF_6$ and one or more hydrofluorocarbon compounds;

g) removing the photoresist layer, thereby forming the core;

h) depositing a second layer of the first Si—Ge composition on the core, wherein the second layer comprises a conformal layer;

i) removing excess second layer of the first Si—Ge composition, thereby exposing the core; and j) depositing a top cladding layer on the core and the second layer of the first Si—Ge composition, thereby fabricating a waveguide.

30. The method of claim 29 wherein subtractively etching further comprises over-etching the layer of the second Si—Ge composition, such that etching is continued into the first layer of the first Si—Ge composition.

31. The method of claim 29, wherein the waveguide is fabricated in an opto-electronic integrated circuit.

32. An opto-electronic integrated circuit structure fabricated according to the method of claim 31.

* * * * *